United States Patent [19]

Shu

[11] Patent Number: 5,442,670
[45] Date of Patent: Aug. 15, 1995

[54] CIRCUIT FOR DIVIDING CLOCK FREQUENCY BY N.5 WHERE N IS AN INTEGER

[75] Inventor: Wen Shu, Santa Clara, Calif.

[73] Assignee: National Semiconductor Corporation, Santa Clara, Calif.

[21] Appl. No.: 198,191

[22] Filed: Feb. 16, 1994

[51] Int. Cl.⁶ .................. H03K 21/00; H03K 19/094
[52] U.S. Cl. ........................................ 377/48; 327/113
[58] Field of Search ............... 328/15; 307/271; 377/48

[56] References Cited

U.S. PATENT DOCUMENTS

| | | | |
|---|---|---|---|
| 4,348,640 | 9/1982 | Clendening | 328/41 |
| 4,366,394 | 12/1982 | Clendening et al. | 307/225 |
| 4,390,960 | 6/1983 | Yamashito et al. | 377/48 |

FOREIGN PATENT DOCUMENTS 0080931 7/1981 Japan ................................ 377/48

Primary Examiner—Margaret R. Wambach
Attorney, Agent, or Firm—H. Donald Nelson; Paul J. Winters; Richard J. Roddy

[57] ABSTRACT

A digital clock divider is capable of dividing a clock frequency n by N.5, where N is an integer, and includes a closed loop of flip-flops numbering twice N.5, and an additional flip-flop to which the clock signal is applied through an inverter, the output signal of the additional flip-flop is 180° out of phase with a signal from a flip-flop of the closed loop. The 180° out-of-phase signals are applied to an OR2 gate, the output signal of which has a frequency of n (clock signal) divided by N.5.

33 Claims, 5 Drawing Sheets

CIRCUIT FOR DIVIDING CLOCK FREQUENCY BY N.5 WHERE N IS AN INTEGER

BACKGROUND OF THE INVENTION

This invention relates to digital clock dividers, and more particularly, to a system for a dividing clock frequency n by N.5, where N is an integer (i.e., divide by 1.5, 2.5, 3.5, etc.).

BACKGROUND OF THE INVENTION

It is well known that in a circuit design, many applications thereof require for their operation signals frequencies which may not be achieved by dividing the clock frequency by an integer. For example, in a wireless communication card, a 20 MHz clock signal may be required for operation of a high performance microcontroller, while a 12 MHz clock signal may be required for operation of the baseband processor and PLL. In order to achieve a solution to this problem with a single oscillator, N.5 dividers (where N is an integer) are needed. In such a case, the 20 MHz and 12 MHz signals can be obtained from a 30 MHz clock with the frequency thereof divided by 1.5 and 2.5 respectively (see FIG. 1).

The above-cited problems of course can be dealt with by providing multiple oscillators. However, it is very advantageous to provide a single oscillator solution, so as to aid in achieving that the circuit is independent of temperature and process factors. Thus, the one oscillator solution shown in FIG. 1, using divide-by-1.5 and divide-by-2.5 circuits, is highly desirable.

It would be most advantageous to achieve the above-cited system with a low cost, low power consumption, small size product, which also has low noise, high performance, and a high degree of reliability.

U.S. Pat. No. 4,348,640 to Clendening discloses a digital circuit which receives symmetrical clock pulses of frequency F and outputs symmetrical pulses of frequency $\frac{1}{3}$ F. This circuit includes a divide-by-1.5 circuit which is based on a pair of flip-flops and a plurality of logic gates which receive clock pulses of frequency F formed in a complex manner. Additionally, there is no disclosure of being able to divide a signal frequency by other than 1.5, i.e., there is no disclosure of dividing a signal frequency by 2.5, 3.5, etc.

Of further interest is U.S. Pat. No. 4,366,394, which discloses a divide-by-3 clock divider with a symmetrical output.

Thus, neither of this patents disclose a simple, efficient circuit for dividing a clock frequency by N.5, where N is a chosen integer.

BRIEF DESCRIPTION OF THE DRAWINGS

Objects of the invention will become apparent from a study of the following specification and drawings, in which.

DESCRIPTION OF THE PREFERRED EMBODIMENT

Figure 1:
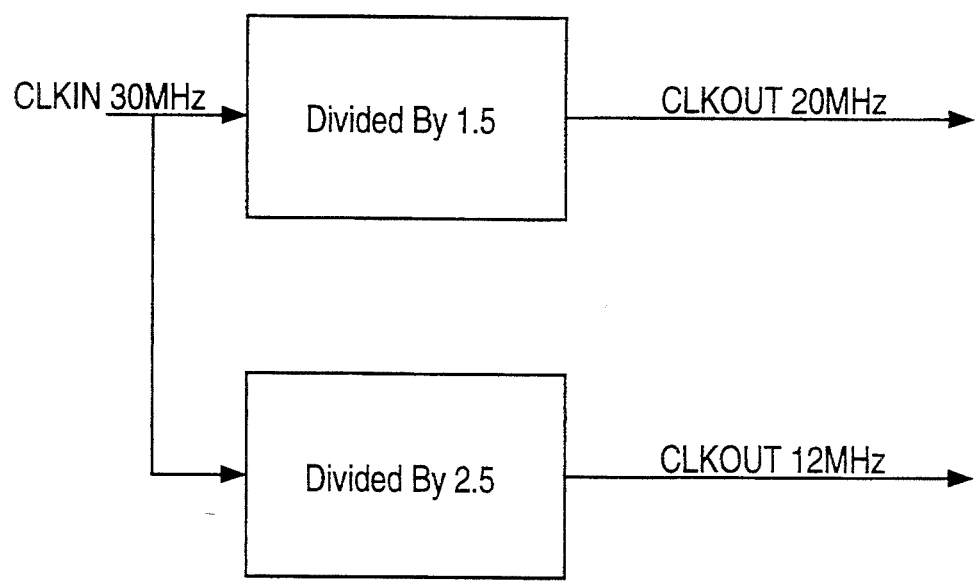
FIG. 1 is a view representing application of the invention, as will be further shown and described.
Figure 2:
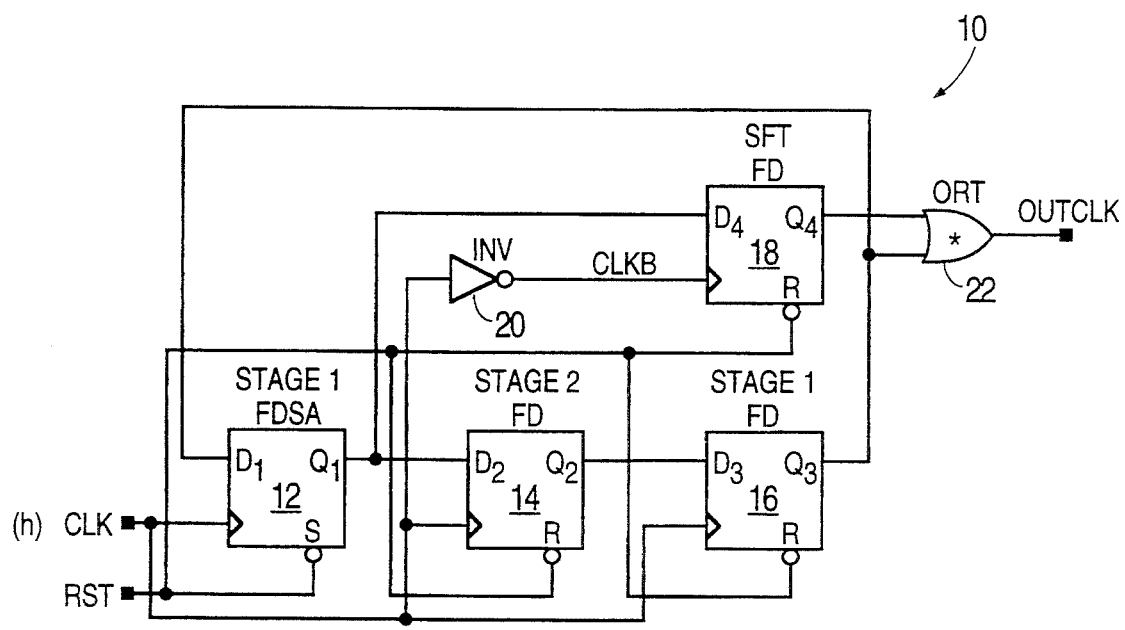
FIG. 2 is a diagram of a divide-by-1.5 circuit in accordance with the present invention.
Figure 3:
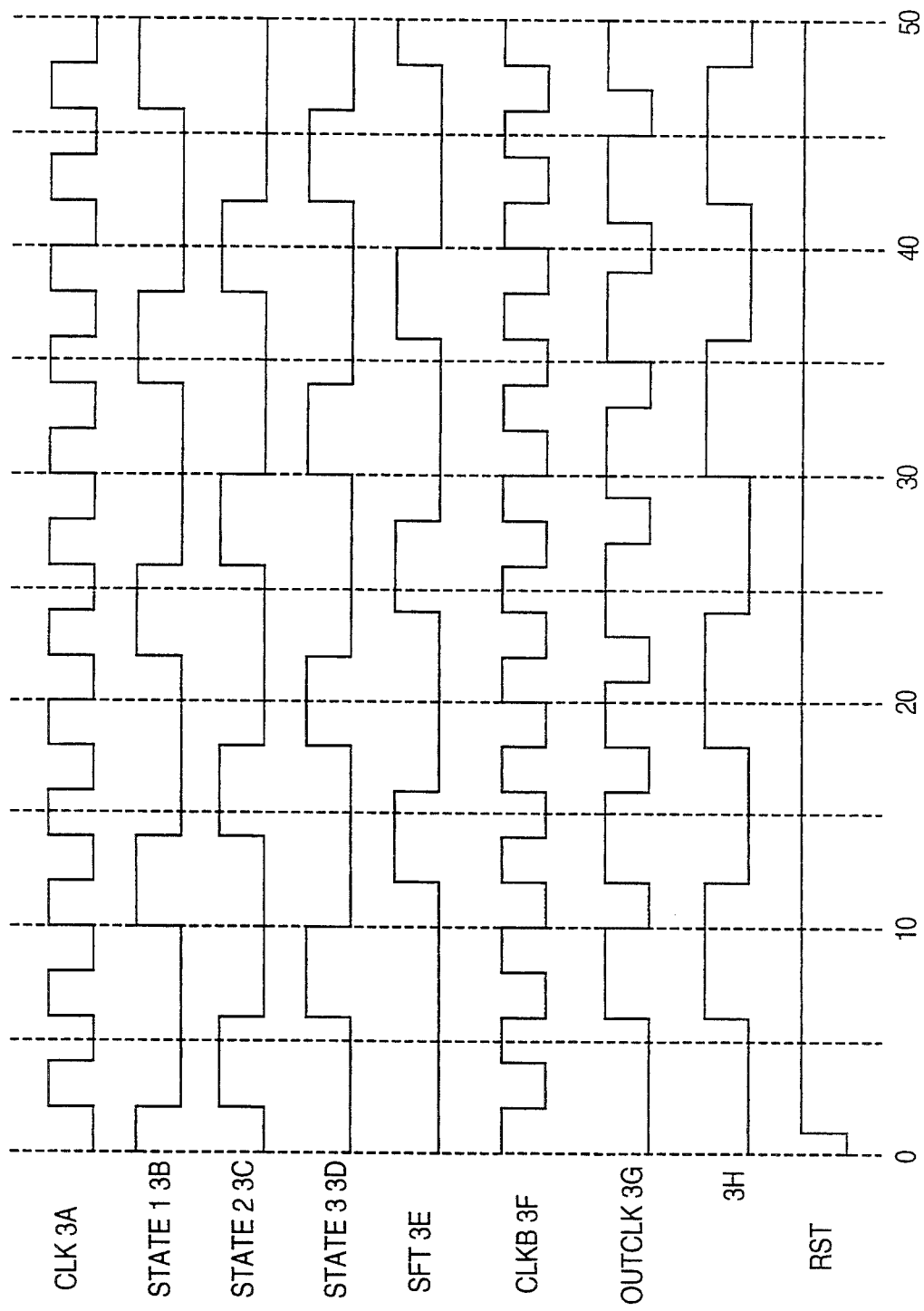
FIG. 3 is a timing diagram of the circuit of FIG. 2.

Shown in FIG. 2 is a first embodiment of the present invention, i.e., in particular a circuit 10 for dividing a clock signal frequency n by 1.5. As shown therein, such circuit 10 includes three flip-flops 12, 14, 16 connected in a closed-loop manner, so that the Q output terminal of a given flip-flop is connected to the D input terminal of the next flip-flop, etc., forming the closed loop. A clock signal (FIG. 3A) is provided to each flip-flop, with the flip-flops being positive-edge-triggered, so that with the clock signal frequency being as indicated at FIG. 3A, the output signals at terminals Q1, Q2, Q3 of flip-flops 12, 14, 16 are shown at FIGS. 3B, 3C, 3D respectively. Thus, it will be seen that the signals shown in FIGS. 3B, 3C, 3D are each $\frac{1}{3}$ the frequency of the clock signal, but are out of phase with each other, each successive signal being phased 120° behind the preceding signal.

Another flip-flop 18 is included, the output terminal Q1 of the flip-flop 12 being connected to the input terminal D4 of that flip-flop 18. The clock signal (FIG. 3A) is provided to the flip-flop 18 through an inverter 20, and thus the clock signal applied to the flip-flop 18 is 180° out of phase with the clock signal applied to the flip-flops 12, 14, 16. This inverted clock signal is shown in FIG. 3F.

Because the flip-flop 18 is also positive edge-triggered, the output signal of the flip-flop 18 at terminal Q4 is as shown in FIG. 3E.

Connecting the flip-flop 18 in the manner disclosed has the effect of shifting the signal from terminal Q1 of flip-flop 12 so that the output signal from terminal Q4 is now 180° out of phase with the output signal from terminal Q3 of the flip-flop 16.

The output signal from terminal Q4 and the output signal from terminal Q3 are applied to the input terminals of an OR2 gate 22, so that the signal at the output terminal of the OR2 gate 22 is as shown in FIG. 3G. As will be noted, this signal has a frequency of the clock signal n divided by 1.5.

The particular circuit as shown and described thus functions in a manner to fi) divide a clock frequency by the number of flip-flops chosen to be in a closed loop; (ii) apply the output signal of one of the flip-flops (i.e., the "last" flip-flop) of (i) to one input terminal of an OR2 gate; (iii) select an output signal of one of the flip-flops of (i) (i.e., the "$N^{th}$" flip-flop, which is the only flip-flop to be preset) which is closest to 180° out of phase with the output signal thus far applied to the OR2 gate (it will be understood that more than one signal may meet that definition—only one is selected); (iv) shift the phase of the output signal of the flip-flop of (iii) so that it is 180° out of phase with the output signal of the flip-flop of (ii); and (v) apply the shifted signal to the other input terminal of the OR2 gate.

The duty cycle of such a circuit can be calculated as $$\text{Duty cycle} = \frac{1}{2 + \frac{1}{N}} \%.$$

If it is desirable to achieve a 50% duty cycle of an output signal of the OR2 gate, the signal of FIG. 3G can be divided by 2, resulting in a signal triggered only by a positive leading edge of the signal, to provide the 50% duty cycle as shown in FIG. 3H.

Figure 4:
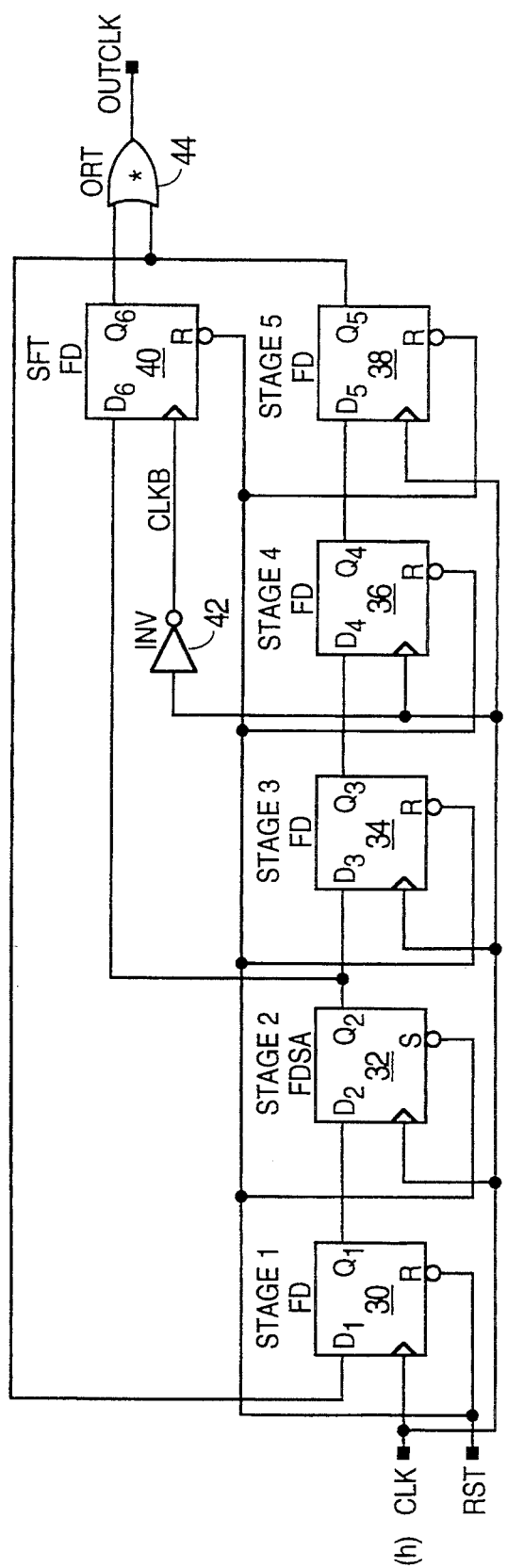
FIG. 4 is a diagram of a divide-by-2.5 circuit in accordance with the present invention.
Figure 5:
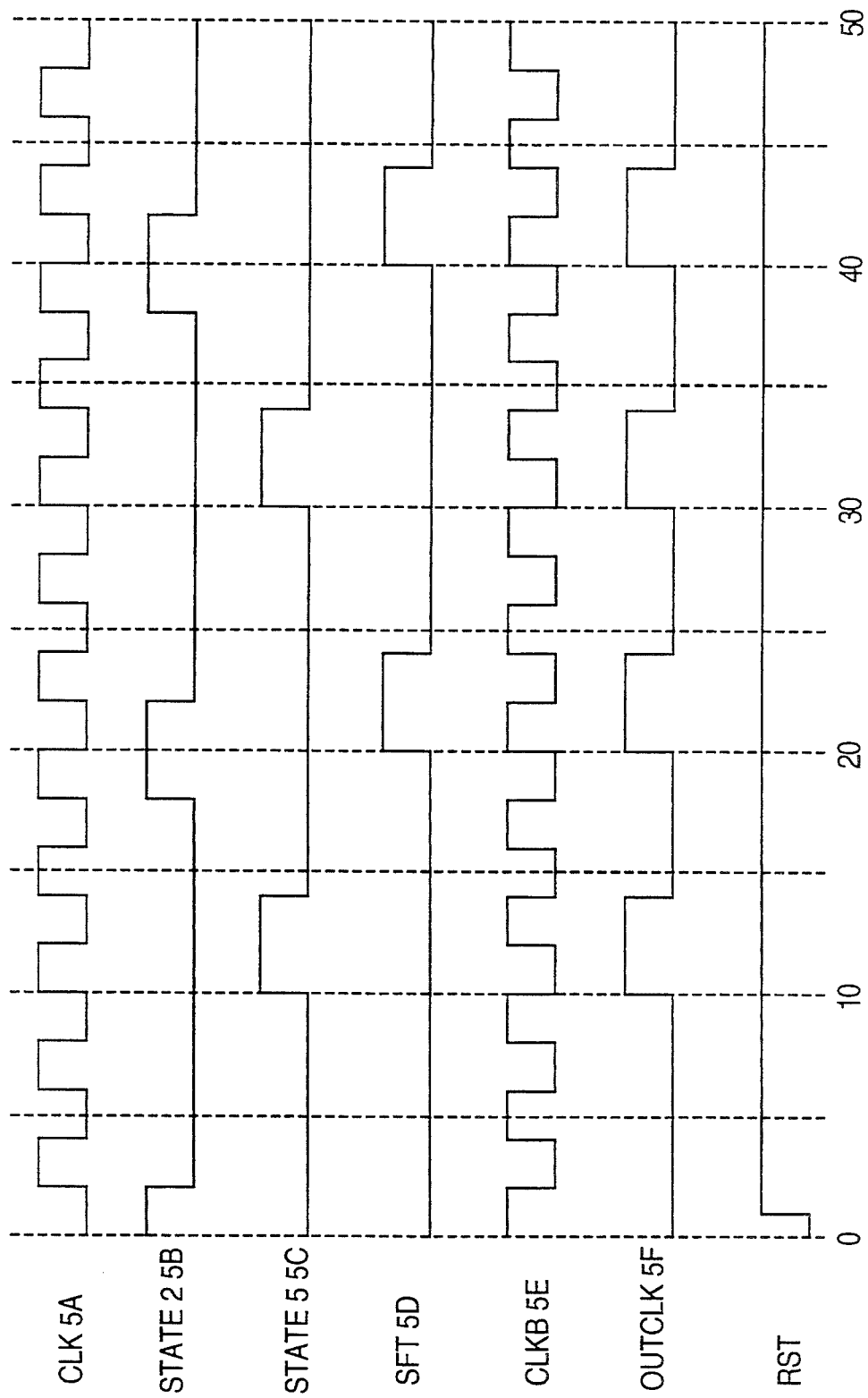
FIG. 5 is a timing diagram of the circuit of FIG. 4.

With reference to FIG. 4, this circuit shows, instead of three flip-flops, five flip-flops 30, 32, 34, 36, 38 in a closed loop. Based on the above description of the operation of the circuit of FIG. 2, it will be seen that the output signal of flip-flop 32 at terminal Q2 is as shown at FIG. 5B, while the output signal of flip-flop 38 at terminal Q5 is as shown at FIG. 5C. The output signal of flip-flop 32 is applied to the input terminal D6 of another flip-flop 40, and again an inverted clock signal is applied to that flip-flop 40 through inverter 42. The output signals of the flip-flop 38 and flip-flop 40 are applied to the input terminals of OR2 gate 44. Again, the signal selected to be applied to the flip-flop 40 is that from the "$N^{th}$" flip-flop, which signal is closest to 180° out of phase from the output signal of the flip-flop 38 at terminal Q5. The flip-flop 40 and inverter 42 have the effect of shifting that selected signal so that it is 180° out of phase with the signal from the terminal Q5 of the flip-flop 38. That shifted signal is shown in FIG. 5D.

Applying the signal from terminal Q5 and the signal from terminal Q6 to an OR2 gate results in an output signal from the OR2 gate as shown in FIG. 5F, which, it will be noted, is the frequency n of the clock signal divided by 2.5.

Again, if a 50% duty cycle is desired, the signal of FIG. 5F can be divided by 2, as described above.

It will thus become apparent from the above that a clock divider circuit for dividing a clock frequency n by N.5, where N is an integer, can readily be achieved by providing a number of flip-flops in a closed loop, wherein that number is twice N.5. That is, if a clock frequency is to be divided by 1.5, three flip-flops are to be used in the closed loop, with another flip-flop used in a shifting portion of the circuit. Similarly, if a clock signal frequency is to be divided by 2.5, five flip-flops are used in the closed loop, with an additional flip-flop used in the phase shifting portion of the circuit.

It will thus be seen that a simple, effective circuit for dividing a clock frequency n by N.5 (where N is an integer) is achieved. The circuit is of small size and low cost, meanwhile being of high reliability and performance, with low power consumption.

I claim:

1. A method of providing a signal of a chosen frequency comprising: providing a first signal of a frequency $n/N_1$, wherein $N_1$ is an integer, and wherein n is the frequency of a given signal; providing a second signal of a frequency $n/N_2$, wherein $N_2$ is an integer, wherein n is the frequency of the given signal, and wherein the phase of the second signal is different from the phase of the first signal; shifting the phase of the second signal; providing the first and second signals as input signals to a function gate; and providing an output signal from the function gate.

2. The method of claim 1 and further providing that the function gate is an OR function gate.

3. The method of claim 1, wherein $N_1 = N_2$.

4. A method of providing a signal of frequency n/N.5 wherein n is the frequency of a given signal and N is an integer, the method comprising the steps of:
providing first and second signals of frequency n/2(N.5) the first and second signals being different in phase;
shifting the phase of the second signal;
providing the first and second signals as input signals to a function gate;
providing an output signal from the function gate;
the phase of the second signal being shifted to provide that the output signal from the function gate has a frequency n/N.5.

5. The method of claim 4 and further providing that the function gate is an OR gate function gate.

6. A method of providing a signal of frequency n/N.5 wherein n is the frequency of a given signal, and N is an integer, the method comprising the steps of:
providing a plurality of signals of frequency $n \div 2(N.5)$, the signals being of different phase;
providing a first selected signal of the plurality thereof as an input signal to a function gate;
providing a second selected signal of the plurality thereof as an input signal to the function gate, the second selected signal being the one of the plurality of signals closest to 180° out of phase with the first selected signal;
shifting the phase of the second selected signal as an input signal to the function gate to provide that the phase thereof is substantially 180° out of phase with the first selected signal; and
providing an output signal from the function gate.

7. The method of claim 5 and further providing that the function gate is an OR function gate.

8. A device for providing a signal of a chosen frequency comprising:
apparatus for providing a first signal of a frequency $n/N_1$, wherein $N_1$ is an integer, and wherein n is the frequency of a given signal;
apparatus for providing a second signal of a frequency $n/N_2$, wherein $N_2$ is an integer, wherein n is the frequency of the given signal, and wherein the phase of the second signal is different from the phase of the first signal; and
apparatus for shifting the phase of the second signal; and
a function gate for receiving the first and second signals as input signals thereto and for providing an output signal therefrom.

9. The apparatus of claim 8 wherein the function gate is an OR function gate.

10. The device of claim 8, wherein $N_1 = N_2$.

11. The device of claim 10, wherein the first and second signals input to the function gate are approximately 180° out of phase.

12. The method of claim 11, wherein the apparatus for shifting shifts the phase of the second signal to be substantially 180° out of phase with the first signal.

13. A device for providing a signal of frequency n/N.5, wherein n is the frequency of a given signal, and N is an integer, comprising:
apparatus for providing first and second signals of frequency $n \div 2(N.5)$, the first and second signals being different in phase;
a function gate for receiving the first and second signals as input signals thereto and for providing an output signal therefrom; and
apparatus for shifting the phase of the second signal to provide that the output signal from the function gate has the frequency n/N.5.

14. The device of claim 13 wherein the function gate is an OR function gate.

15. A device for providing a signal of frequency n/N.5, wherein n is the frequency of a given signal and N is an integer, the device comprising:

apparatus for providing a plurality of signals of frequency n÷2(N.5), the signals being of different phase;

a function gate;

apparatus for providing a first selected signal of the plurality thereof as an input signal to the function gate;

apparatus for providing a second selected signal of the plurality thereof, the second selected signal being the one of the plurality of signals closest to 180° out of phase with the first selected signal; and apparatus for shifting the phase of the second selected signal to provide that the phase thereof is 180° out of phase with the first selected signal and providing the second signal as an input signal to the function gate, an output signal being provided from the function gate.

16. The device of claim 15 and further providing that the function gate is an OR function gate.

17. A device for providing a clock signal of frequency n÷N.5, where n is the frequency of a reference signal and N is an integer, the device comprising:

a circuit providing a plurality of at least 2(N.5) signals of frequency n÷2(N.5), the plurality including a first signal and a second signal, the second signal being the one of the plurality of signals closest to 180° out of phase with the first signal; and a gate receiving the first and second signals as input signals and providing the clock signal as output.

18. The device of claim 17, further comprising a phase-shift circuit that phase-shifts the second signal so that the second signal is substantially 180° out of phase with the first signal.

19. The device of claim 18, wherein the circuit comprises a ring of 2(N.5) flip-flops connected in a closed-loop manner so that an output terminal of each flip-flop in the ring is connected to an input terminal of the next flip-flop in the ring.

20. The device of claim 19, wherein the phase-shift circuit comprises a phase-shift flip-flop having an input terminal connected to the output of one of the 2(N.5) flip-flops, and wherein the second signal is taken from an output of the phase-shift flip-flop.

21. The device of claim 20, wherein the gate performs an OR function.

22. The device of claim 20, wherein the 2(N.5) flip-flops and the phase-shift flip-flop are positive-edge-triggered flip-flops.

23. The device of claim 22, wherein 2(N.5) flip-flops share a common clock signal and the circuit further comprises an inverter coupled between the common clock signal and the phase-shift flip-flop.

24. A method of providing a signal of frequency n ÷N.5, where n is the frequency of a reference clock signal and N is an integer, the method comprising the steps of:

providing a plurality of at least 2(N.5) signals of frequency n÷2(N.5);

selecting a first of the plurality of signals;

selecting a second of the plurality of signals, the phase of the second signal being the one of the plurality of signals closest to 180° out of phase with the first signal; and performing an OR function on the first and second signals, whereby the result of the OR function has a frequency of n÷N.5.

25. The method of claim 24, further comprising the step of shifting the phase of the second signal so that the first and second signals are substantially 180° out of phase.

26. The method of claim 24, wherein the result of the OR function is divided by 2.

27. A device for providing a clock signal of frequency n÷N.5, where n is the frequency of a first reference clock signal and N is an integer, the device comprising:

a ring of 2(N.5) flip-flops clocked by the first reference clock signal and connected in a closed-loop manner so that an output terminal of each flip-flop in the ring is connected to an input terminal of the next flip-flop in the ring;

a phase-shift flip-flop clocked by a second reference clock signal of frequency n and receiving as input an output of a first of the 2(N.5) flip-flops; and a circuit for performing the OR function on the output of the phase-shift flip-flop and the output of a second of the 2(N.5) flip-flops, wherein the output of the phase-shift flip-flop and is substantially 180° out of phase with the output of the second of the 2(N.5) flip-flops.

28. The device of claim 27, wherein the second reference clock signal is the inverse of the first reference clock signal.

29. The device of claim 28, further comprising an inverter comprised of an input and an output, the inverter receiving as input the first reference clock signal, whereby the second reference clock signal is provided at the output of the inverter.

30. The device of claim 27, wherein the output of a first of the 2(N.5) flip-flops is the output signal of the one of the 2(N.5) flip-flops that provides an output signal closest to 180° out of phase with the output of the second of the 2(N.5) flip-flops.

31. The device of claim 30, wherein the 2(N.5) flip-flops and the phase-shift flip-flop are positive-edge-triggered flip-flops.

32. The method of claim 31, wherein the second signal is shifted to be substantially 180° out of phase with the first signal during the step of shifting.

33. The device of claim 27, wherein the circuit is an OR gate.

* * * * *

UNITED STATES PATENT AND TRADEMARK OFFICE
CERTIFICATE OF CORRECTION

PATENT NO.   :   5,442,670
DATED        :   August 15, 1995
INVENTOR     :   Wen Shu It is certified that error appears in the above-identified patent and that said Letters Patent is hereby corrected as shown below:

Column 1,   line 52, delete "this" and insert --these--.

Column 2,   line 45, delete "fi)" and insert --_(i)_--;

line 47, delete "(ii)" and insert --_(ii)_--;

line 48, delete "(i)" and insert --_(i)_--;

line 49, delete "(iii)" and insert --_(iii)_--;

line 50, delete "(i)" and insert --_(i)_--;

line 54, delete "(iv)" and insert --_(iv)_--;

line 55, delete "(iii)" and insert --_(iii)_--; and line 57, delete "(ii)" and insert --_(ii)_--, and delete "(v)" and insert --_(v)_--.

Signed and Sealed this

Second Day of January, 1996

Attest:

BRUCE LEHMAN

*Attesting Officer*           *Commissioner of Patents and Trademarks*